US009834097B2

(12) United States Patent
Shin

(10) Patent No.: US 9,834,097 B2
(45) Date of Patent: Dec. 5, 2017

(54) HYBRID POWER CONTROL APPARATUS FOR VEHICLE

(71) Applicants: Hyundai Motor Company, Seoul (KR); Kia Motors Corporation, Seoul (KR)

(72) Inventor: Dong Min Shin, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 422 days.

(21) Appl. No.: 14/562,698

(22) Filed: Dec. 6, 2014

(65) Prior Publication Data

US 2015/0328993 A1 Nov. 19, 2015

(30) Foreign Application Priority Data

May 14, 2014 (KR) .................. 10-2014-0057517

(51) Int. Cl.
*B60L 11/18* (2006.01)
*F01P 3/12* (2006.01)
(Continued)

(52) U.S. Cl.
CPC .............. *B60L 11/18* (2013.01); *B60L 11/08* (2013.01); *F01P 3/12* (2013.01); *H02M 1/00* (2013.01);
(Continued)

(58) Field of Classification Search
CPC ........... B60L 11/18; B60L 11/08; H02M 7/48; H02M 7/5387; B60K 6/20; B60K 11/06;
(Continued)

(56) References Cited

U.S. PATENT DOCUMENTS 7,692,923 B2 * 4/2010 Nakamura ......... H05K 7/20927
165/104.33
7,745,952 B2 * 6/2010 Nakatsu .................. B60L 11/08
257/706

(Continued)

FOREIGN PATENT DOCUMENTS

JP 05-260763 A 10/1993
JP 2005-151747 A 6/2005
(Continued)

*Primary Examiner* — Ryan Johnson
(74) *Attorney, Agent, or Firm* — Mintz Levin Cohn Ferris Glovsky and Popeo, P.C.; Peter F. Corless

(57) ABSTRACT

A hybrid power control apparatus for a vehicle includes an inverter module disposed in a housing; a low DC-DC converter (LDC) module disposed in the housing; and a component mounting part attachably/detachably assembled in the housing. In the hybrid power control apparatus, the inverter module includes a plurality of power modules; a cooler contacts both surfaces of each power module so as to carry out heat conduction, the cooler assembled to the component mounting part; and a capacitor module assembled in a form where the capacitor module is stacked on one side of the cooler so as to carry out heat conduction. As a result of this structure, cooling efficiency can be improved, and the inverter module, the converter module, and a controller are packed in one closed space, thereby reducing the size of the hybrid power control apparatus.

6 Claims, 6 Drawing Sheets

(51) Int. Cl.
  *B60L 11/08* (2006.01)
  *H02M 7/537* (2006.01)
  *H02M 3/335* (2006.01)
  *H02M 1/00* (2006.01)
  *H02M 7/5387* (2007.01)
  *H05K 7/20* (2006.01)

(52) U.S. Cl.
  CPC ... *H02M 3/33507* (2013.01); *H02M 3/33569* (2013.01); *H02M 7/537* (2013.01); *H02M 7/5387* (2013.01); *H05K 7/209* (2013.01); *F01P 2050/24* (2013.01); *H02M 2001/0058* (2013.01)

(58) Field of Classification Search
  CPC ......... B60K 11/00; B60K 11/04; B60K 11/02; F01P 3/12; F01P 3/20; F01P 2050/24; F01P 1/06
  See application file for complete search history.

(56) References Cited

U.S. PATENT DOCUMENTS

| | | | |
|---|---|---|---|
| 7,978,471 B2* | 7/2011 | Tokuyama | H01L 23/36 165/104.33 |
| 8,946,567 B2* | 2/2015 | Nakatsu | B60L 11/14 174/520 |
| 9,585,292 B2* | 2/2017 | Horiuchi | H05K 7/20927 |

FOREIGN PATENT DOCUMENTS

| | | |
|---|---|---|
| JP | 2008-029117 A | 2/2008 |
| JP | 2011-105291 A | 6/2011 |
| JP | 2012-110207 A | 6/2012 |
| KR | 10-2009-0007059 | 1/2009 |
| KR | 10-2009-0132031 | 12/2009 |
| KR | 10-2010-0005956 | 1/2010 |
| KR | 10-0998810 B1 | 11/2010 |
| KR | 10-2012-0002322 | 1/2012 |

* cited by examiner

HYBRID POWER CONTROL APPARATUS FOR VEHICLE

CROSS-REFERENCE TO RELATED APPLICATION

This application claims under 35 U.S.C. §119(a) the benefit of Korean Patent Application No. 10-2014-0057517 filed on May 14, 2014, the entire contents of which are incorporated herein by reference.

BACKGROUND (a) Technical Field

The present invention relates to a hybrid power control apparatus for a vehicle, more particularly, to a hybrid power control apparatus in which an inverter module, a low DC-DC converter (LDC) module and a controller are packed in one closed space, thereby improving cooling efficiency and assembly performance.

(b) Description of the Related Art

A green vehicle using an electric motor as a driving source, such as a hybrid vehicle or electric vehicle, generally uses a high voltage battery or the like as an energy source for driving the electric motor. The green vehicle uses, as power conversion components, an inverter for providing power to the motor and a low DC-DC converter (LDC) for generating 12V of power for a vehicle.

The inverter converts DC power of the high voltage battery between the electric motor and the high voltage battery into three-phase AC power and provides the converted three-phase AC power to the motor. The LDC (or converter) converts the DC power of the high voltage battery into 12V of power for a vehicle and supplies the converted 12V of power to vehicle electric components.

Recently, an inverter, a converter and a controller for controlling the same (the inverter and the converter) have been integrally configured in a package, and the package is referred to as a hybrid power control unit (HPCU). An HPCU for a green car requires improvement of cooling efficiency, and compactness, simplification and high efficiency through improvement of a packaging structure.

FIG. 1 (RELATED ART) is a view schematically showing a power control apparatus for a green vehicle according to the related art.

As shown in FIG. 1, the related art power control apparatus includes a converter 2 installed in a first housing 1, and an inverter 4 and a controller 5 installed in the second housing 3. The first and second housings 1 and 3 are disposed adjacent to each other.

The inverter 4 is configured with a plurality of power modules such as insulated gate bipolar transistors (IGBTs), and a gate board and a capacitor module are configured to control the power modules.

The related art power control apparatus has at least the following disadvantages.

First, the housing for the inverter is configured separately from that for the converter, and therefore, it is difficult to reduce the size of the related art power control apparatus.

Second, the gate board and the controller (control board) are disposed with the capacitor module interposed therebetween, and therefore connected through wiring. Hence, a space for wiring is required.

Third, although not shown in FIG. 1, the power module employs a cooling structure in which only one surface of the power module is cooled, and therefore, the cooling efficiency of the power module is low.

Fourth, since there is no cooling structure of the capacitor module, there is a limit in reducing the size of the capacitor module and cooling the capacitor module.

Fifth, mounting components including the converter, the inverter, the controller and the like are installed one-by-one in the closed first and second housings, and therefore, it is difficult to guarantee assembly performance.

SUMMARY

The present invention provides a hybrid power control apparatus for a vehicle, in which an efficiency cooling structure is applied, thereby improving cooling efficiency, and an inverter, a converter and the controller are packed in a simple structure in one closed space, thereby reducing the size of the hybrid power control apparatus.

In one aspect, the present invention provides a hybrid power control apparatus for a vehicle, including: an inverter module disposed at one of upper and lower sides in a housing; a low DC-DC converter (LDC) module disposed at the other of the upper and lower sides in the housing; and a component mounting part attachably/detachably assembled in the housing, wherein the inverter module includes: a plurality of power modules; a cooler that contacts both surfaces of each power module so as to carry out heat conduction, the cooler assembled at one of upper and lower sides of the component mounting part; and a capacitor module assembled at the one of the upper and lower sides in a form where the capacitor module is stacked on one side of the cooler so as to carry out heat conduction.

In an exemplary embodiment, the LDC module may be assembled at the other of the upper and lower sides of the component mounting part to be disposed at the opposite side of the inverter module, and be contacted with the other side of the cooler by the medium of the component mounting part so as to carry out heat conduction.

In another exemplary embodiment, a thermally conductive thermal grease may be applied between each power module and the cooler, between the capacitor module and the cooler, and between the component mounting part and the cooler.

In still another exemplary embodiment, the plurality of power modules may be divided into two groups at both left and right sides to be disposed in two lines. A high voltage connection part may be provided at one of the left and right sides, and a low voltage connection part may be provided at the other of the left and right sides. The power module disposed at the one of the left and right sides and the power module disposed at the other of the left and right sides may be disposed opposite to each other, based on the high voltage connection part and the low voltage connection part.

In yet another exemplary embodiment, the inverter module may be configured to include gate boards respectively disposed at both left and right sides of the component mounting part. A controller disposed below the LDC module may be assembled with the component mounting part. The gate board and the controller may be configured with plate-shaped circuit boards each having a connecter provided at one side thereof, and be disposed at right angles to each other to be connected through the connectors.

In still yet another exemplary embodiment, a cooler plate may be stacked on one side of the cooler, and a buffer spring may be assembled with a fastening member for coupling between the cooling plate and the component mounting part, assembled with the cooler interposed therebetween.

Other aspects and exemplary embodiments of the invention are discussed infra.

According to the hybrid power control apparatus of the present invention, cooling efficiency is improved by an efficient cooling structure using one cooler, and simultaneously, the inverter, the converter and the controller are packed in a simple structure in one closed space, thereby reducing the size of the hybrid power control apparatus.

The above and other features of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
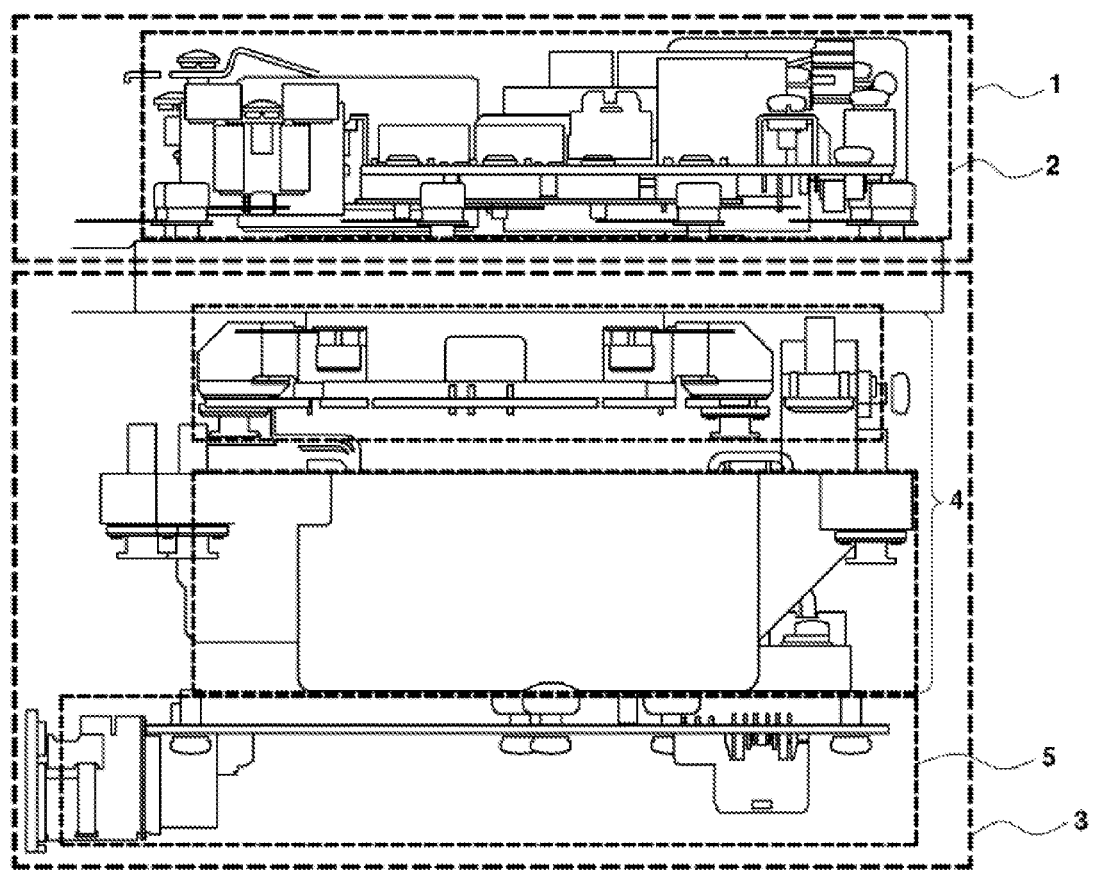
FIG. 1 (RELATED ART) is a view schematically showing a power control apparatus for a green vehicle according to the related art.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

The present invention provides a hybrid power control apparatus for a green vehicle, which is configured by packing, in one closed space, an inverter module and a low DC-DC converter (LDC) module, for controlling power supplied to an electric motor and electric components of the vehicle, and a controller for controlling the inverter module and the LDC module. Accordingly, an efficient cooling structure is employed, so that it is possible to improve cooling efficiency and to promote simplification of a packaging structure and reduction in size. Further, a component mounting part in a housing is configured to be separable, and various components (the inverter module, the LDC module, the controller and the like) are assembled with the component mounting part to be modularized, and the modularized assembly is fastened in the housing, thereby improving assembly performance.

Figure 2:
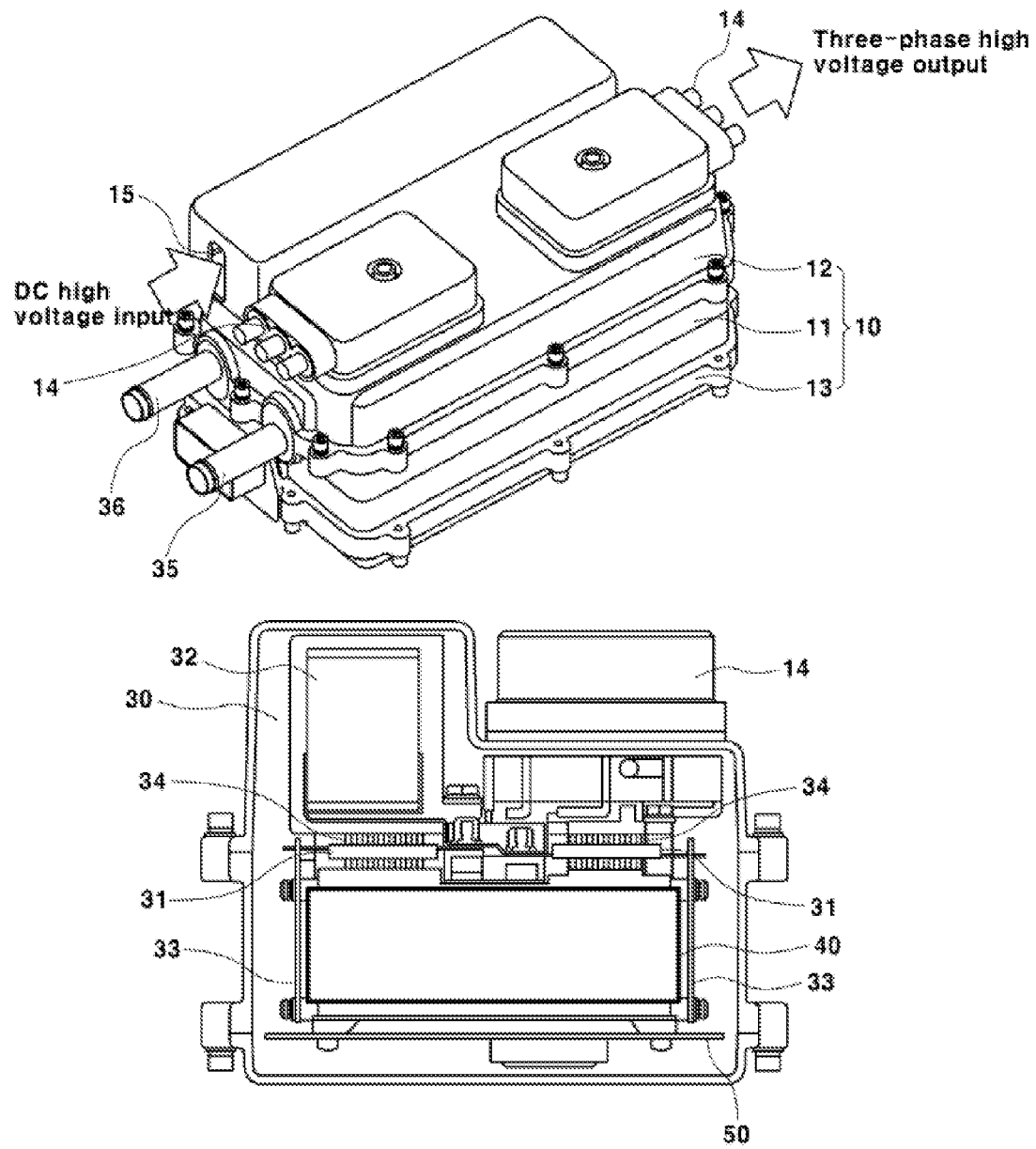
FIG. 2 illustrates an external perspective view and an internal configuration view, showing a hybrid power control apparatus for a vehicle according to an embodiment of the present invention.
Figure 3:
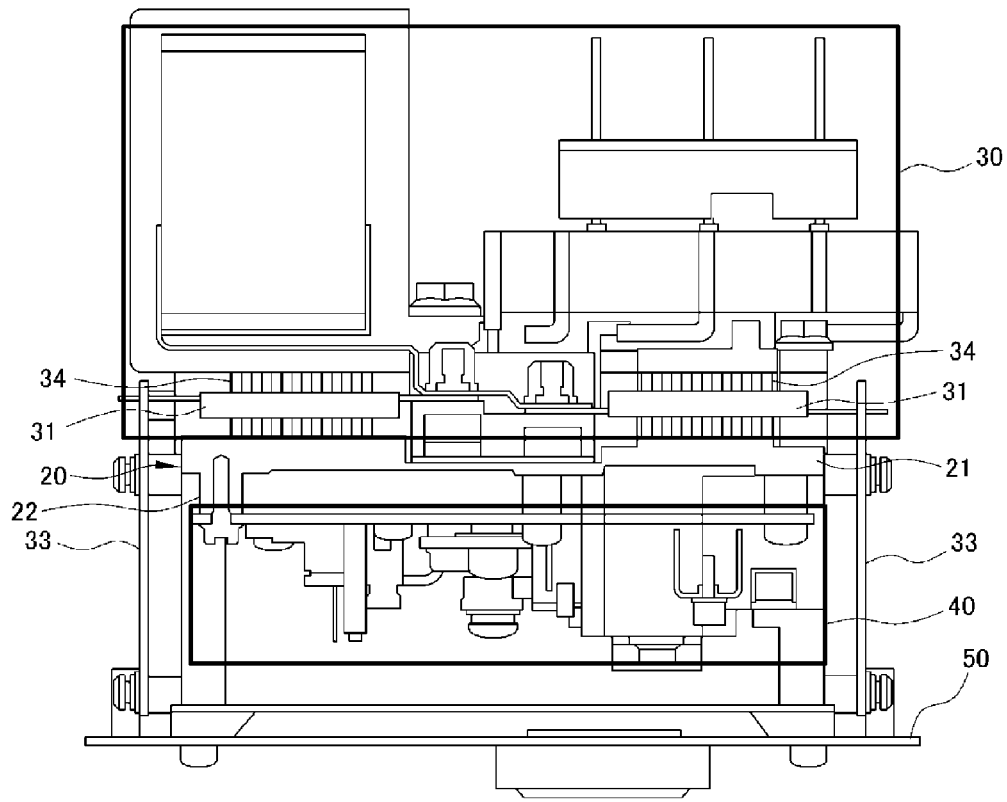
FIG. 3 is a configuration view showing the hybrid power control apparatus, except a housing, according to the embodiment of the present invention.

As shown in FIGS. 2 and 3, a hybrid power control apparatus according to an embodiment of the present invention is generally configured to include a housing 10 having a closable internal space, a component mounting part 20 installed in the housing 10, an inverter module 30 and an LDC module 40, mounted to the component mounting part 20, and a controller 50.

The housing 10 includes a middle housing 11 formed in a box shape having opened top and bottom ends, and upper and lower covers 12 and 13 respectively coupled to the top and bottom ends of the middle housing 11.

The housing 10 is provided with an input connection part 15 for a high voltage DC input supplied from a high voltage battery (not shown), an output connection part 14 for a high voltage output (three-phase AC) generated in the inverter module 30 receiving the high voltage DC input supplied from the high voltage battery, and a low voltage output connection part (not shown) for a low voltage output generated by converting the high voltage DC input.

In this state, the input connection part 15 enables the high voltage battery outside the housing 10 and the inverter module 30 inside the housing 10 to be electrically connected to each other, and the output connection part 14 enables the inverter module 30 inside the housing 10 and an electric motor (not shown) outside the housing 10 to be electrically connected to each other. The low voltage output connection part (not shown) enables the LDC module 40 inside the housing 10 and an auxiliary battery (not shown) outside the housing 10 to be electrically connected to each other.

As provided herein, the input connection part 15, the output connection part 14 and the low voltage output connection part may be formed as connectors or terminals.

The inside of the housing 10 may be generally divided, based on the component mounting part 20, into a space in which the inverter module 30 is positioned and a space in which the LDC module is positioned.

The component mounting part 20 includes a panel part 21 formed in an approximately plate shape and a plurality of supports 22 provided at an edge of the panel part 21. Based on the component mounting part 20 (specifically, the panel part 21), the inverter module 30 is installed at an upper side in the housing 10, and the LDC module 40 is installed at a lower side in the housing 10.

The inverter module 30 is configured with a plurality of power modules 31 that may include switching elements, a capacitor module 32, gate boards 33, coolers 34, and the like. The LDC module 40 is configured with a power board, an inductor, a transformer, a diode, and the like.

The component mounting part 20 is attachably/detachably coupled in the middle housing 11 of the housing 10 to be positioned in the housing 10. Before the component mounting part 20 is fastened to the middle housing 11, the inverter module 30 and the LDC module 40 preferably are first mounted in an opened space outside the housing 10 to be modularized, and then coupled in the middle housing 11.

With the assembly modularized by integrally assembling the inverter module 30 and the LDC module 40, using the component mounting part 20 (referred to as an inverter & LDC module), the inverter & LDC module is assembled in an opened space and then assembled in the middle housing 11. The upper and lower covers 12 and 13 are assembled in the middle housing 11, thereby improving assembly convenience and assembly quality.

Figure 4:
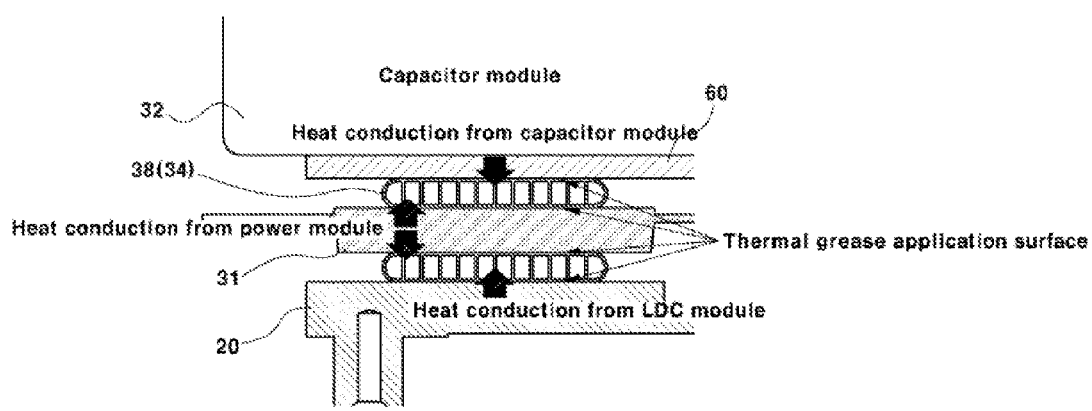
FIG. 4 is a view schematically showing a heat conducting structure using one cooler in the hybrid power control apparatus according to the embodiment of the present invention.

In order to improve cooling efficiency and promote reduction in size, the inverter module 30, as shown in FIG. 4, uses a cooler 34 contacted with both surfaces of each power module 31 and simultaneously contacted with one side of the capacitor module 32. In addition, the cooler 34 is contacted with one side of the LDC module 40 by the medium of the component mounting part 20.

Figure 5:
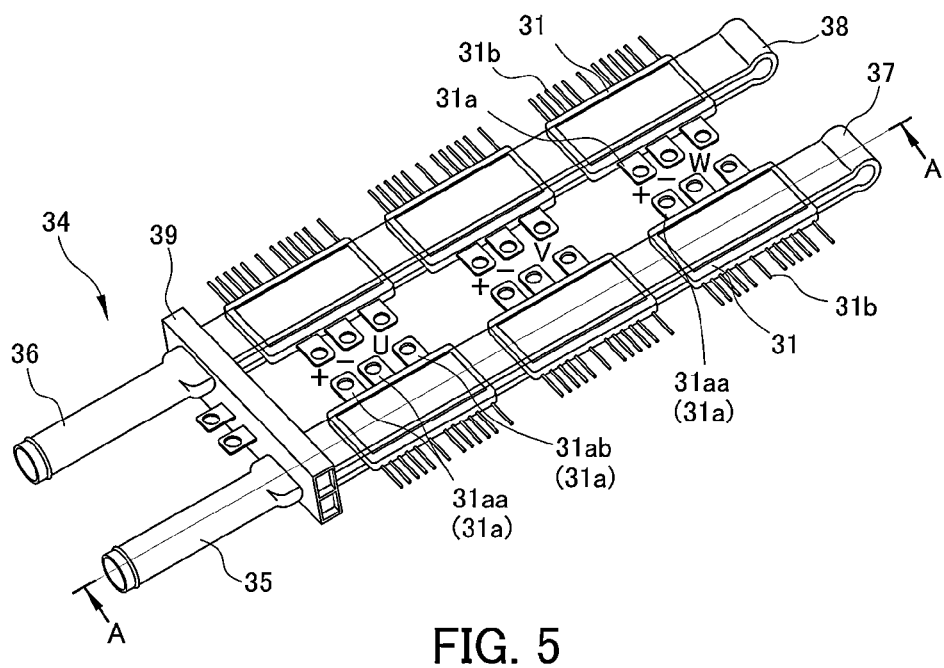
FIG. 5 is a view showing an arrangement structure of the cooler and power modules in the hybrid power control apparatus according to the embodiment of the present invention.

FIG. 5 illustrates an arrangement of the power modules 31 mounted in the housing 10 and a contact state of the power modules 31 with the cooler 34. As shown in FIG. 5, the plurality of power modules 31 constituting the inverter module 30 are divided into two groups at both left and right sides to be disposed in two lines, and the cooler 34 is formed to cool both the surfaces of each power module 31.

For reference, in the case of a green vehicle using two driving motors, three power modules are connected to one driving motor, so that a total of six power modules are provided in a hybrid power control unit (HPCU).

Figure 6:
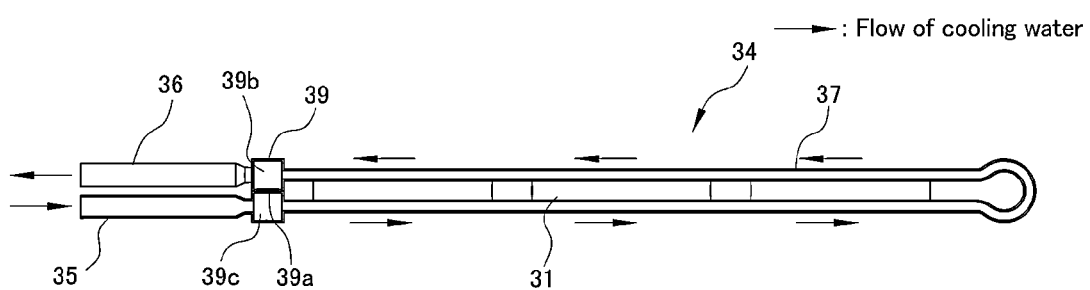
FIG. 6 is a sectional view taken along line A-A of FIG. 5.

As shown in FIGS. 5 and 6, the cooler 34 is based on a pipe structure having a cooling flow path for movement and circulation of cooling water. The cooler 34 may be configured with a flow path inlet 35 for inflow of the cooling water, a flow path outlet 36 for discharge of the cooling water, a first cooling part 37 contactable with both top and bottom surfaces of the plurality of power modules 31 arranged in one line at one of the left and right sides, a second cooling part 38 contactable with both upper and lower surfaces of the plurality of power modules 31 arranged in one line at the other of the left and right sides, and a divide 39 for division of cooling water flowed in through the flow path inlet 35.

The flow path inlet 35 and the flow path outlet 35 are integrally connected at one side of the divide 39, and the first and second cooling parts 37 and 38 are integrally connected at the other side (the opposite side) of the divide 39. Thus, cooling water flowing in the cooler 34 through the flow path inlet 35 is separately flowed in the first and second cooling parts 37 and 38, circulated in the first and second cooling parts 37 and 38, and then discharged to the outside of the cooler 34 through the flow path outlet 36.

In order to prevent mixture between the cooling water flowed in the first and second cooling parts 37 and 38 and the cooling water discharged from the first and second cooling parts 37 and 38, the divide 39 has a barrier film 39a formed therein to block the vertical movement of the cooling water.

In particular, the divide 39 divides the cooling flow path into a two-layer structure through the internal bather film 39a. Accordingly, the cooling water flowed in the flow path inlet 35 is flowed in the first and second cooling parts 37 and 38 through a lower-layer cooling flow path 39c and then discharged to the flow path outlet 36 through an upper-layer cooling flow path 39b.

The first cooling part 37 has a bent central portion and is connected to the divide 39 to communicate with the upper-layer cooling flow path 39b. The second cooling part 38 has a bent central portion and is connected to the divide 39 to communicate with the lower-layer cooling flow path 39c. Each of the first and second cooling parts 37 and 38 surrounds the plurality of power modules 31 arranged in one line through its form, and is simultaneously contacted with both the surfaces of each power module 31.

The capacitor module 32 is mounted in a form where the capacitor module 32 is stacked on the top end of the power module 31, to be contacted with a top surface of the cooler 34, specifically, the first cooling part 37 (or the second cooling part 38 according to the arrangement structure). The LDC module 40 is mounted to a bottom side of the component mounting part 20, so that heat generation components (e.g., an inductor, an FET, a transformer, a diode, and the like) among components of the LDC module 40 are arranged to correspond to the cooling water route of the cooler 34.

As shown in FIG. 4, a thermally conductive thermal grease is applied between each power module 31 and the cooler 34 (specifically, the first and second cooling parts 37 and 38, between the capacitor module 32 and the cooler 34 (specifically, the capacitor module 32 and the first cooling part 37), and between the component mounting part 20 and the cooler 34 (specifically, the first and second cooling parts 37 and 38), thereby increasing the contact areas.

Through the package structure described above, the cooler 34 is contacted with both the top and bottom surfaces of each power module 31 so as to carry out heat conduction, and simultaneously contacted with one side (bottom end surface of the capacitor module 32 and one side (top end surface) of the LDC module 40 so as to carry out heat conduction. Thus, the power modules 31, the capacitor modules 32 and the LDC module 40 are all cooled by the one cooler 34, so that it is possible to improve cooling efficiency and to promote reduction in sizes of components in the housing 10, thus reducing material cost while maintaining stability.

Specifically, the capacitor module 32 is mounted to be stacked on the top surface of the cooler 34 so that cooling of the capacitor module 32 is performed by conducting heat generated in the capacitor module 32 to the cooling water in the cooler 34. Accordingly, it is possible to reduce the capacity and size of capacitors and to save material cost.

The LDC module 40 is configured so that the heat generation components among the components constituting the LDC module 40 are positioned beneath the cooler 34, so that heat conduction is made through the cooling water of the cooler 34, thereby achieving the cooling of the LDC module 40.

As shown in FIG. 5, each power module 31 has a high voltage connection part 31a provided at one of the left and right sides thereof, and has a low voltage connection part 31b provided at the other of the left and right sides thereof. The high voltage connection part 31a of the power module disposed at one of the left and right sides (specifically, the side of the first cooling part 37) and the low voltage connection part 31b of the power module disposed at the other of the left and right sides (specifically, the side of the second cooling part 38) are disposed opposite to each other, thereby improving electromagnetic performance.

In this state, the high voltage connection part 31a of each power module 31 is positioned at an inside (i.e., between the first and second cooling parts 37 and 38, based on the cooler 34, and the low voltage connection part 31b is positioned at an outside (i.e., an outside of the first or second cooling part 37 or 38).

The high voltage connection part 31a is configured with a DC input part 31aa electrically connected to the capacitor module 32, and an AC output part 31ab electrically connected to the motor outside the housing 10. The low voltage connection part 31b is configured to be electrically connectable to the gate board 33 for controlling the power modules 31.

Figure 7:
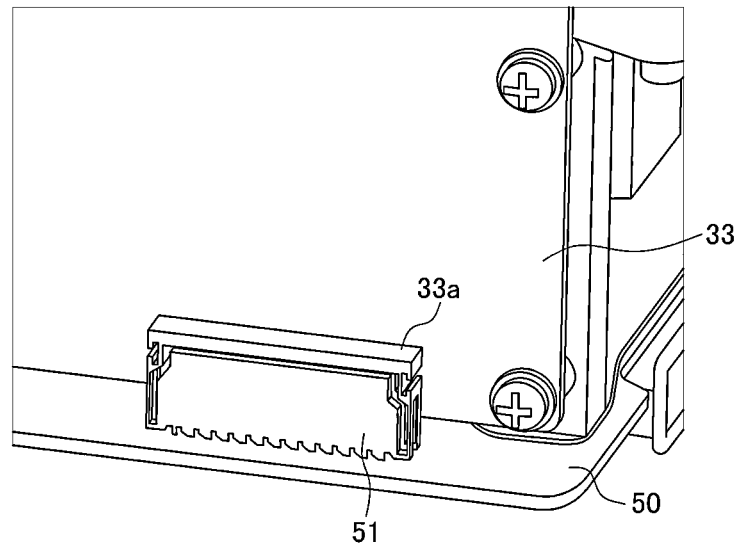
FIG. 7 is a view showing a connection structure between a controller and a gate board in the hybrid power control apparatus according to the embodiment of the present invention.

Referring to FIGS. 3 and 7, the gate boards 33 for controlling operations of the power modules are respectively disposed at both sides of the component mounting part 20. The controller 50 for controlling the inverter module 30 and the LDC module 40 is disposed below the component mounting part 20 (specifically, below the LCD module 40 mounted beneath the component mounting part 20).

In this state, the gate board 33 and the controller 50 are configured with plate-shaped circuit boards. When the gate board 33 and the controller 50 are assembled to be fixed to the supports 22 provided at both the left and right sides of the component mounting part 20, the gate board 33 and the controller 50 are positioned at right angles to each other.

As the gate board 33 and the controller 50 are disposed at right angles to each other, the connector to connector connection may be employed as an interface between the gate board 33 and the controller 50, rather than the existing wiring connection.

In other words, a connector may be used as a means for signal connection between the gate board 33 and the controller 50, and the gate board 33 and the controller 50 are connected to each other by connecting a first connector 33a provided to the gate board 33 to a second connector 51 provided to the controller 50, so that it is possible to eliminate the existing wiring for interface and to improve the interface structure between the gate board 33 and the controller 50. Accordingly, it is possible to promote reduction in size and saving of material cost.

In addition, the controller 50 integrally performs functions of a controller for the inverter module and a controller for the LDC module, and accordingly, it is possible to promote reduction in size and saving of material cost.

Meanwhile, the cooler 34 is assembled between the component mounting part 20 and a cooler plate 60 to be adhered closely to both the surfaces of each power module 31. In order to improve cooling efficiency, it is required to maximally increase and maintain the contact area between the cooler 34 and the power module 31. To this end, it is required to press the cooler 34 with a strong force at both upper and lower sides of the power module 31.

In particular, the contact area between the cooler 34 and the power module 31 is maximally maintained by the force where the cooler 34 is pressed at both the upper and lower sides, thereby maintaining an optimal cooling state.

However, in the environment of the vehicle, impact or vibration is occasionally transferred to the vehicle, which acts as a factor that deteriorates the durability of components.

The component mounting part 20, the capacitor module 32, the cooler plate 60 and the like, which are pressing the top and bottom surfaces of the cooler 34, continuously receive a load (energy) from the outside by external vibration or impact. However, if there is no separate device, the durability performance of these components may be weakened and therefore broken down. The weakening of the durability performance of the components means the weakening of the rigidity of the components. The force where the cooler is pressed is weakened due to the weakening of the rigidity of the components, and as a result, the cooling performance is deteriorated.

Accordingly, in order to improve the durability of the components against external impact or vibration, a buffer spring 62 is provided to a fastening member 61 for coupling between the component mounting part 20 and the cooler plate 60.

Figure 8:
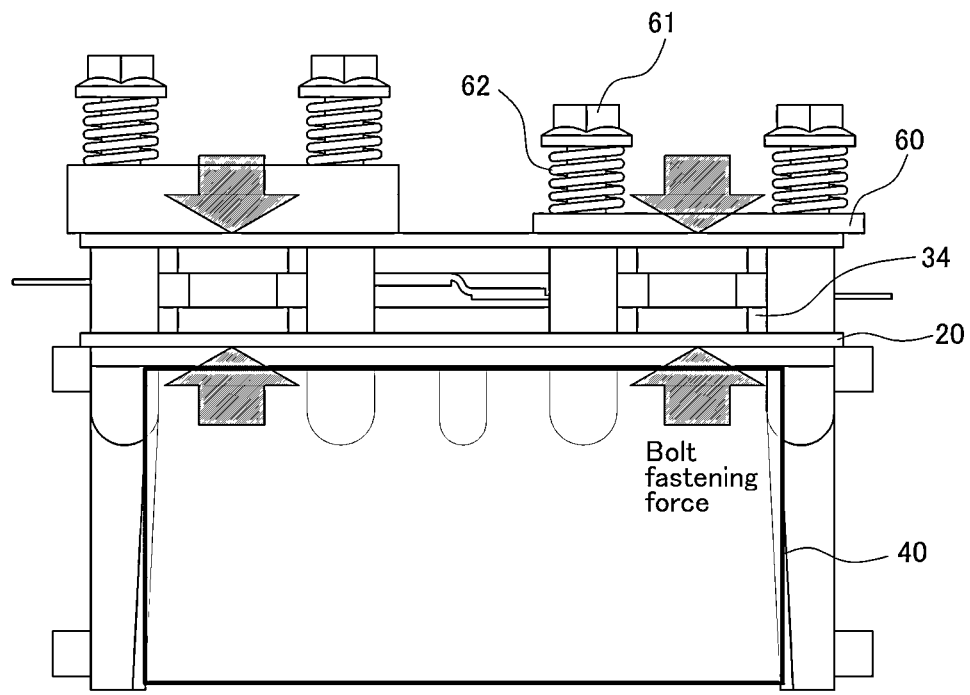
FIG. 8 is a view showing an impact absorbing structure using a buffer spring in the hybrid power control apparatus according to the embodiment of the present invention.

Specifically, as shown in FIG. 8, the buffer spring 62 may be used as a means for absorbing a load generated from external vibration or impact by inserting the buffer spring 62 between the cooler plate 60 and the fastening member 61 or by inserting the buffer spring 62 between the component mounting part 20 and the fastening member 61, even though not shown in this figure.

In particular, the buffer spring 62 elastically supports the cooler 34 between the component mounting part 20 and the cooler plate 60 by the fastening force of the fastening member 61 to absorb impact energy applied from the outside. Thus, the buffer spring 62 performs a function of blocking the impact energy that deteriorates the durability performance of the component mounting part 20, the capacitor module 32, the cooler plate 60 and the like, which are pressing the cooler 34.

In addition, the force (force for maintaining contact between the cooler 34 and the components including the power module 31, the component mounting part 20, the cooler plate 60 and the like) applied to the cooler 34 is constantly maintained by the force where the buffer spring 62 is continuously pressed. Thus, it is possible to reduce a variation in cooling performance according to the elapse of time, thereby maintaining constant and continuous cooling performance for a long period of time.

Further, only the buffer spring 62 is added without using any complicated structure, thereby obtaining the maximum performance with relatively low price.

In order not to block the heat conduction of the cooler 34, the cooler plate 60 and the component mounting part 20 are preferably made of a heat conductive material.

Since the cooler plate 60 is positioned between the cooler 34 and the capacitor module 32, the thermal grease for increasing the contact area between the capacitor module 32 and the cooler 34 may be applied between the capacitor module 32 and the cooler plate 60 or between the cooler plate 60 and the cooler 34. Alternatively, the thermal grease may be applied both between the capacitor module 32 and the cooler plate 60 and between the cooler plate 60 and the cooler 34.

As described above, in the present invention, the cooling efficiency of the power module 31 is improved using the cooler 34 capable of performing both surface cooling, and simultaneously, the power module 31, the LDC module 40 and the capacitor module 32 are all cooled using the one cooler 34, so that it is possible to simplify the HPCU packaging structure and to promote reduction in size of the capacitor module 32. In addition, the connection between the controller 50 and the gate board 33 is simplified, thereby implementing a packaging structure in which the size of the HPCU is reduced.

Further, in the present invention, the packaging structure is optimized by mounting all of the inverter module 30 including the capacitor module 32 and the gate board 33, the LDC module 40 and the controller 50 in the one closed space (i.e., the housing). In this state, the inverter module 30, the LDC module 40 and the controller 50 are integrally assembled and modularized using the component mounting part 20 attachable/detachable to the housing 10 and then mounted in the housing 10, so that it is possible to improve assembly performance and to minimize or prevent assembly related quality issues.

Figure 9:
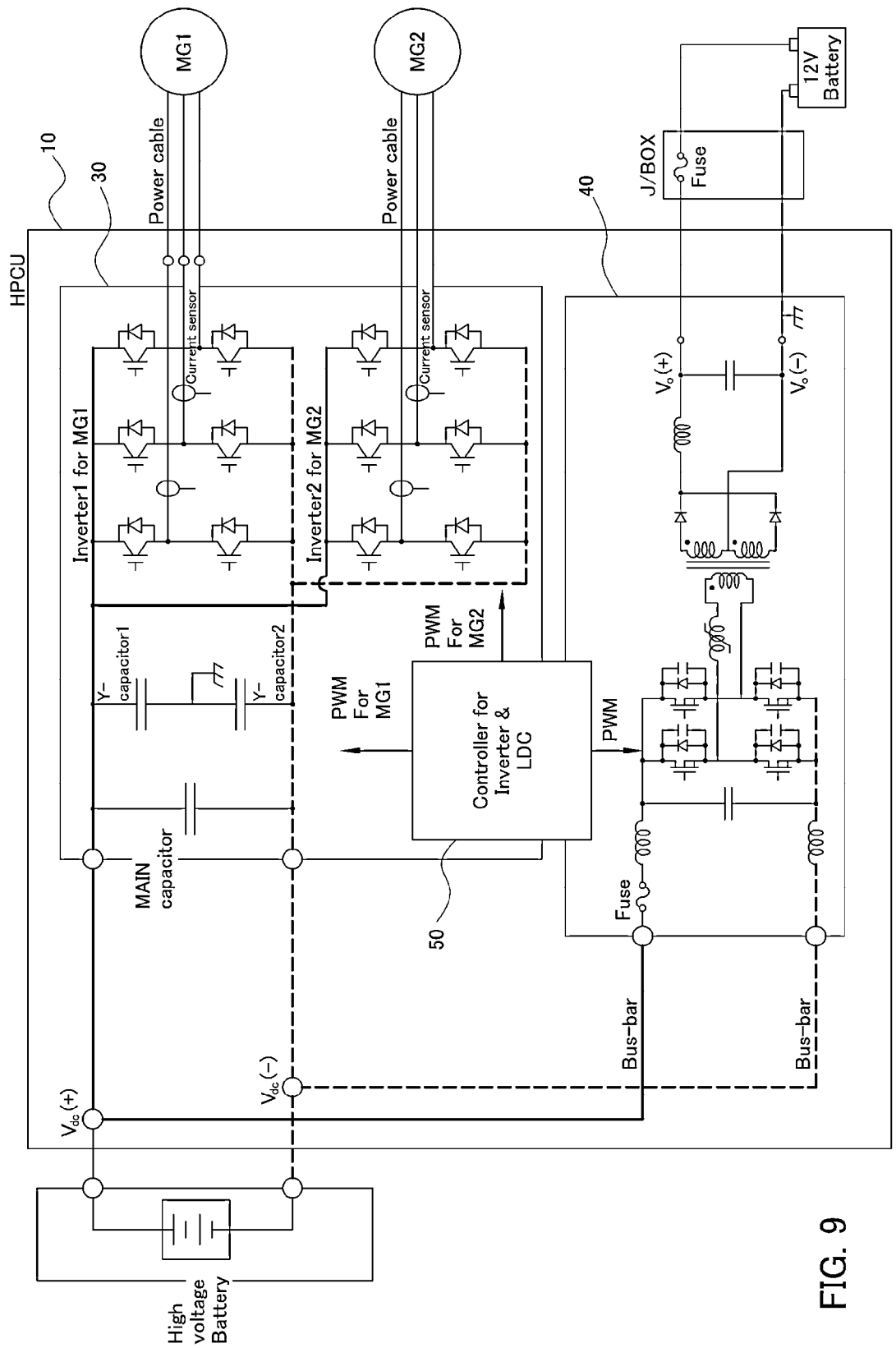
FIG. 9 is a circuit diagram showing the hybrid power control apparatus according to the embodiment of the present invention.

For reference, the hybrid power control apparatus configured in the one closed space (housing) as described above can be represented by a circuit shown in FIG. 9.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A hybrid power control apparatus for a vehicle, comprising:
an inverter module disposed at one of upper and lower sides in a housing;
a low DC-DC converter (LDC) module disposed at the other of the upper and lower sides in the housing; and
a component mounting part attachably/detachably assembled in the housing,
wherein the inverter module includes:
a plurality of power modules;
a cooler that contacts both top and bottom surfaces of each power module so as to carry out heat conduction, the cooler assembled at one of upper and lower sides of the component mounting part; and
a capacitor module assembled at the one of the upper and lower sides of the component mounting part in a form where the capacitor module is stacked on one side of the cooler so as to carry out heat conduction.

2. The hybrid power control apparatus of claim 1, wherein the LDC module is assembled at the other of the upper and lower sides of the component mounting part to be disposed at the opposite side of the inverter module, and is contacted with the other side of the cooler by a medium of the component mounting part so as to carry out heat conduction.

3. The hybrid power control apparatus of claim 1, wherein a thermally conductive thermal grease is applied between each power module and the cooler, between the capacitor module and the cooler, and between the component mounting part and the cooler.

4. The hybrid power control apparatus of claim 1, wherein the plurality of power modules are divided into two groups at both left and right sides to be disposed in two lines,
wherein a high voltage connection part is provided at one of the left and right sides, and a low voltage connection part is provided at the other of the left and right sides, and
wherein the power module disposed at the one of the left and right sides and the power module disposed at the other of the left and right sides are disposed opposite to each other, based on the high voltage connection part and the low voltage connection part.

5. The hybrid power control apparatus of claim 1, wherein the inverter module is configured to include gate boards respectively disposed at both left and right sides of the component mounting part,
wherein a controller disposed below the LDC module is assembled with the component mounting part, and
wherein the gate board and the controller are configured with plate-shaped circuit boards each having a connecter provided at one side thereof, and are disposed at right angles to each other to be connected through the connectors.

6. The hybrid power control apparatus of claim 1, wherein a cooler plate is stacked on one side of the cooler, and a buffer spring is assembled with a fastening member for coupling between the cooling plate and the component mounting part, assembled with the cooler interposed therebetween.

* * * * *